(12) United States Patent
Xiang

(10) Patent No.: US 12,089,336 B2
(45) Date of Patent: Sep. 10, 2024

(54) ELECTRONIC COMPONENT PACKAGE BODY, ELECTRONIC COMPONENT ASSEMBLY STRUCTURE, AND ELECTRONIC DEVICE

(71) Applicant: Huawei Digital Power Technologies Co., Ltd., Shenzhen (CN)

(72) Inventor: Zhiqiang Xiang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 44 days.

(21) Appl. No.: 17/669,142

(22) Filed: Feb. 10, 2022

(65) Prior Publication Data

US 2022/0256709 A1 Aug. 11, 2022

(30) Foreign Application Priority Data

Feb. 10, 2021 (CN) .......................... 202110183926.9

(51) Int. Cl.
*H05K 1/18* (2006.01)
*H01L 23/31* (2006.01)
*H01L 25/16* (2023.01)

(52) U.S. Cl.
CPC .......... *H05K 1/181* (2013.01); *H01L 23/3121* (2013.01); *H01L 25/16* (2013.01); *H05K 2201/10719* (2013.01)

(58) Field of Classification Search
CPC .............. H05K 1/18; H05K 1/181–185; H01L 23/498; H01L 23/49811; H01L 23/3121
USPC ................. 361/770–795, 803; 257/664–674, 257/690–699
See application file for complete search history.

(56) References Cited

U.S. PATENT DOCUMENTS 4,353,108 A * 10/1982 Chippel ................. H05K 5/064
174/559
4,787,853 A * 11/1988 Igarashi ............... H05K 3/3421
439/55

(Continued)

FOREIGN PATENT DOCUMENTS

CN 102420205 A 4/2012
CN 112309998 A 2/2021

(Continued)

*Primary Examiner* — Tuan T Dinh
(74) *Attorney, Agent, or Firm* — Leydig, Voit & Mayer, Ltd.

(57) ABSTRACT

Embodiments of this application disclose an electronic component package body, an electronic component assembly structure, and an electronic device. The electronic component assembly structure includes: an electronic component package body, where the electronic component package body includes a substrate, an electronic component, and a pin; the electronic component is packaged inside the substrate, and the pin is electrically connected to the electronic component; the pin includes a first part embedded in the substrate, and a second part protruding from the substrate; the second part includes a bottom surface and a side surface, the bottom surface is an outer surface that is of the pin and that is away from the substrate, and the side surface is connected between the bottom surface and the substrate. In this application, reliability of soldering between the electronic component package body and the circuit board is relatively high.

17 Claims, 8 Drawing Sheets

(56) References Cited

U.S. PATENT DOCUMENTS

| | | | | |
|---|---|---|---|---|
| 5,936,843 | A * | 8/1999 | Ohshima | H05K 1/141 |
| | | | | 174/250 |
| 6,137,062 | A * | 10/2000 | Zimmerman | H05K 3/3436 |
| | | | | 361/768 |
| 8,064,221 | B2 * | 11/2011 | Kuroda | H05K 3/3442 |
| | | | | 438/615 |
| 8,203,853 | B2 * | 6/2012 | Chen | H01R 13/719 |
| | | | | 361/836 |
| 2004/0251527 | A1 * | 12/2004 | Van Puymbroeck | H01L 23/13 |
| | | | | 257/678 |
| 2005/0207131 | A1 * | 9/2005 | Prokofiev | H05K 7/1092 |
| | | | | 257/E23.079 |
| 2011/0244629 | A1 | 10/2011 | Gong et al. | |
| 2013/0285223 | A1 | 10/2013 | Salamone | |
| 2019/0109018 | A1 | 4/2019 | Balaraman et al. | |
| 2019/0311978 | A1 * | 10/2019 | Cheah | H01L 23/49838 |
| 2020/0194348 | A1 | 6/2020 | Choi et al. | |
| 2020/0312797 | A1 | 10/2020 | Kang et al. | |

FOREIGN PATENT DOCUMENTS

| | | | |
|---|---|---|---|
| CN | 113056098 | A | 6/2021 |
| JP | H05102381 | A | 4/1993 |
| JP | H1140221 | A | 2/1999 |
| JP | 2000223184 | A | 8/2000 |
| JP | 2006260961 | A | 9/2006 |
| KR | 20120047098 | A | 5/2012 |

\* cited by examiner

ELECTRONIC COMPONENT PACKAGE BODY, ELECTRONIC COMPONENT ASSEMBLY STRUCTURE, AND ELECTRONIC DEVICE

CROSS-REFERENCE TO RELATED APPLICATION

This application claims priority to Chinese Patent Application No. 202110183926.9, filed on Feb. 10, 2021, which is hereby incorporated by reference in its entirety.

TECHNICAL FIELD

Embodiments of this application relate to the field of packaging technologies, and in particular, to an electronic component package body, an electronic component assembly structure, and an electronic device.

BACKGROUND

With the development of electronic products towards multifunction and portability, embedded chip packaging becomes a hot research topic in the field of electronic component packaging technologies. In an existing embedded chip package substrate, a land grid array (LGA) is generally used to fasten a packaged component and a circuit board. However, because the land grid array is a type of surface-mount packaging, the packaged component and the circuit board are soldered through surface contact, soldering reliability is relatively poor, and a solder joint is easily broken, thereby affecting reliability of the packaged component.

SUMMARY

This application provides an electronic component package body, an electronic component assembly structure, and an electronic device. A pin of the electronic component package body provided in this application has soldering areas of different dimensions, thereby improving reliability of soldering between the electronic component package body and a circuit board in the electronic component assembly structure.

According to a first aspect, this application provides an electronic component assembly structure. The electronic component assembly structure includes an electronic component package body, a circuit board, and a solder joint soldered between the circuit board and the electronic component package body. The electronic component package body includes a substrate, an electronic component, and a pin. The electronic component is packaged inside the substrate. The pin is electrically connected to the electronic component, and a partial structure of the pin is exposed relative to the substrate, for soldering to the circuit board. The electronic component may be an active component such as a chip, or may be a passive component such as a capacitor, an inductor, or a resistor. For example, there are a plurality of electronic components. In this application, the electronic component is packaged in the package body, and the substrate is a carrier for packaging the electronic component and provides functions such as electrical connection, protection, support, heat dissipation, and assembly for the packaged electronic component.

For example, the substrate includes a packaging layer and a first circuit layer. The electronic component is packaged inside the packaging layer. The first circuit layer and the packaging layer are stacked. The first circuit layer has a first surface and a second surface that are disposed opposite to each other. The first surface is located between the packaging layer and the second surface. Each pin includes a first part and a second part connected to the first part. The first part is embedded in the first circuit layer. The second part protrudes from the second surface. It may be understood that the second surface is a bottom surface of the electronic component package body, and the electronic component package body provides the pin from the bottom surface.

In some possible implementations, the second part includes a bottom surface and a side surface. The bottom surface is an outer surface that is of the pin and that is away from the packaging layer, and the side surface is located between the bottom surface and the second surface. It may be understood that both the bottom surface and the side surface are exposed relative to the second surface. The solder joint surrounds the second part that is of the pin and that protrudes from the second surface. That is, the solder joint surrounds the bottom surface and the side surface of the second part. As shown in FIG. 3, the solder joint is located not only on the bottom surface of the pin but also on the side surface of the second part, to surround the second part.

In this embodiment, the pin protrudes from the substrate, so that a part of the pin soldered to the circuit board is a three-dimensional pin. The pin has soldering areas of different dimensions, and the solder joint can be connected to not only the bottom surface of the pin but also the side surface of the pin, thereby increasing a soldering area of the pin, enhancing soldering strength of the pin in different dimensions, and improving reliability of soldering between the electronic component package body and the circuit board. When the electronic component package body and the circuit board are assembled and soldered, both a bottom wall of the pin and a side wall of the protruding pin may be covered with tin, so that the solder joint surrounds the bottom surface and the side surface of the pin.

In some possible implementations, there are a plurality of pins, and the plurality of pins are disposed at intervals. It may be understood that the pins use conducting materials, and insulating materials are spaced between the plurality of pins. In some embodiments, the part that is of the pin and that is embedded in the first circuit layer and the part that is of the pin and that protrudes from the first circuit layer may be integrally formed, or may be formed in steps. This application does not limit a technology for forming the pin in the electronic component package body, which may be an etching technology or a laser soldering technology. A person skilled in the art can design the technology based on an actual requirement.

A material used for the first part is the same as a main material used for the second part. For example, main materials used for the first part and the second part may be, but are not limited to, copper, aluminum, or gold. It may be understood that the material used for the first part that is of the pin and that is embedded in the first circuit layer is not remelted in a soldering process, to ensure reliability of a circuit of the electronic component package body. The material used for the first part is the same as the main material used for the second part. That is, neither the first part nor the second part of the pin is remelted.

In this embodiment, the main materials used for the first part and the second part of the pin are different from a material used for the solder joint. The first part and the second part of the pin are not remelted in a process of soldering the electronic component package body to the circuit board, and shapes of the first part and the second part are substantially unchanged, to improve soldering reliability of an electronic device. However, in a conventional technology, when soldering between the electronic component package body and the circuit board is implemented by using a ball grid array (ball grid array, BGA), a solder ball is remelted and deformed in the soldering process.

In some possible implementations, a side surface of at least one of the pins includes an inclined surface. For example, the second part of the pin may be a trapezoidal body or a truncated pyramid.

In this embodiment, the side surface of the second part includes an inclined surface, and a cross-sectional shape of the second part may be a trapezoid, so that on a basis that a height of the second part is the same, a surface area of the side surface of the second part is enlarged to further increase the soldering area of the pin, thereby improving reliability of soldering between the electronic component package body and the circuit board.

In some possible implementations, a side surface of at least one of the pins includes a stepped surface. For example, the second part of the pin may be a stepped structure. In this embodiment, a cross-sectional shape of the second part of the pin may be a stepped shape, so that a surface area of the side surface of the second part is enlarged to further increase the soldering area of the pin, thereby improving reliability of soldering between the electronic component package body and the circuit board. A specific shape of the second part of the pin is not limited in this embodiment of this application. A person skilled in the art can design the specific shape based on an actual requirement.

In some possible implementations, a second part of at least one of the pins includes a curved surface. For example, the second part of the pin is a circular truncated cone. In this embodiment, a side surface of the pin is a curved surface. In this embodiment, the second part is a circular truncated cone, so that on a basis that a height of the second part is the same, a surface area of the side surface of the second part is enlarged to further increase the soldering area of the pin, thereby improving reliability of soldering between the electronic component package body and the circuit board.

In some possible implementations, an area of the bottom surface is greater than an area of a cross section that is of the pin and that is along a surface of the substrate. That is, the area of the bottom surface is greater than an area of a cross section that is of the pin and that is along the second surface.

In this embodiment, the area of the bottom surface of the pin is greater than the area of the cross section that is of the pin and that is along the second surface, so that after the electronic component package body is soldered to the circuit board, the solder joint and the pin may form an interlocking force in a vertical direction, to further improve strength of the solder joint in a thickness direction of the electronic component package body, thereby avoiding a failure of the solder joint caused by long-term vibration of the electronic component, and improving reliability of the electronic device.

In some possible implementations, the solder joint includes a first segment and a second segment connected to the first segment. The first segment is located between the bottom surface of the pin and the circuit board, and the second segment is disposed around the side surface of the pin. A projection of the second segment on the circuit board partially overlaps a projection of the bottom surface of the pin on the circuit board. It may be understood that, after the electronic component package body is soldered to the circuit board, the solder joint that connects the electronic component package body and the circuit board in the electronic device forms an interlocking structure with the pin.

In this embodiment, the area of the bottom surface of the pin is greater than the area of the cross section that is of the pin and that is along the second surface, so that the solder joint and the pin may form an interlocking force in a vertical direction, to further improve strength of the solder joint in a thickness direction of the electronic component package body, thereby avoiding a failure of the solder joint caused by long-term vibration of the electronic component, and improving reliability of the electronic device.

In some possible implementations, the material used for the solder joint includes tin, and the main material used for the second part is different from the material used for the solder joint. It may be understood that the material used for the solder joint includes tin, and in a process of soldering the electronic component package body to the circuit board, the solder joint is remelted to wrap the second part, thereby effectively soldering the electronic component package body to the circuit board.

In this embodiment, the material used for the solder joint includes tin, and the material used for the solder joint is different from the main material used for the second part, so that the second part is not remelted in a process of soldering the electronic component package body to the circuit board. That is, a shape of the second part is substantially unchanged in the soldering process, so that the solder joint effectively surrounds the second part, thereby improving reliability of soldering between the electronic component package body and the circuit board.

In some possible implementations, a groove is disposed on a side that is of at least one of the pins and that is away from the substrate. That is, a groove is disposed on a side that is of the pin and that faces the circuit board. The groove is recessed from a bottom surface of the pin to a side of the substrate. A partial structure of the solder joint is embedded in the groove. It may be understood that the groove does not penetrate the pin. For example, there are a plurality of grooves. A second part of at least one of the pins includes a plurality of sub-pins. The plurality of sub-pins are disposed at intervals, and the plurality of sub-pins are all connected to a first part. Second parts of some pins of the plurality of pins include a plurality of sub-pins that are disposed at intervals. The grooves divide the second part into a plurality of sub-pins that are disposed at intervals. For example, the plurality of sub-pins are symmetrically arranged. The plurality of sub-pins are arranged in a matrix form. A gap between any two adjacent sub-pins is less than a gap between any two adjacent pins.

In this embodiment, a groove is disposed on a side that is of a single pin and that is away from the substrate, thereby increasing an exposed surface area of the single pin. A partial structure of the solder joint is embedded in the groove, thereby further increasing a soldering area of the single pin. The groove may be filled with solder when the electronic component package body is soldered, thereby further improving reliability of soldering between the electronic component package body and the circuit board. A width, a depth, a quantity, or the like of any groove is not limited in this application. A person skilled in the art can design a size of the groove based on an actual requirement or a machine requirement. For example, in a method for preparing the electronic component package body, a second part of a single pin may be segmented, to divide the second part of the single pin into a plurality of sub-pins that are disposed at intervals. A segmentation method may be, but is not limited to, etching or a laser.

In some possible implementations, the electronic component package body has a first side surface and a second side surface that are disposed opposite to each other. The second surface is connected between the first side surface and the second side surface, and the plurality of pins include a first pin and a second pin. The first pin is closest to the first side surface, the second pin is closest to the second side surface, and grooves are disposed on sides that are of the first pin and the second pin and that are away from the substrate.

In this embodiment, a possibility of a fatigue failure caused by vibration of the electronic device is relatively high for a pin at an edge of the electronic component package body. Therefore, the pin at the edge of the electronic component package body is segmented to form a plurality of sub-pins that are disposed at intervals. This not only improves soldering reliability of the edge pin, but also avoids increasing costs by segmenting all pins. In another embodiment, the second part of each pin may alternatively have a plurality of sub-pins that are disposed at intervals. This is not limited in this application.

In some possible implementations, a pad is disposed on a side that is of the substrate and that is away from the circuit board. For example, the substrate further includes a second circuit layer stacked with the packaging layer. The pad is embedded in the second circuit layer. It may be understood that the second circuit layer is disposed on a top surface of the electronic component package body, and the first circuit layer is disposed on the bottom surface of the electronic component package body.

In this embodiment, the electronic component package body has the first circuit layer and the second circuit layer that are disposed opposite to each other, so that both surfaces (the top surface and the bottom surface) of the electronic component package body have circuit layers capable of electrical connection. This can provide a good foundation for double-sided interconnection of the electronic component packaged in the electronic component package body, and facilitate realization of a shortest interconnection path and a thin package of the substrate in a limited space layout, thereby having high practicability and high reliability.

In some possible implementations, the electronic component package body further includes a bonding wire. The pad includes a first pad and a second pad. The first pad and the second pad are disposed at intervals, and are electrically connected by using the bonding wire. The bonding wire may be a metal wire or a metal strip. That is, the second circuit layer uses wire bonding and/or clip bonding. A quantity, a position, a shape, and the like of the pad on the second circuit layer are not limited in this application. A person skilled in the art can design the quantity, the position, the shape, and the like of the pad based on an actual requirement.

In this embodiment, the second circuit layer is formed on an upper surface of the substrate, and the first pad and the second pad on the second circuit layer are electrically connected by using the bonding wire, thereby avoiding remelting of the first pad and the second pad in a solder reflow process when the first pad and the second pad are soldered through solder reflow. In this way, reliability of the electronic component package body is improved.

In some possible implementations, the electronic component package body further includes a package body. The package body is located on the side that is of the substrate and that is away from the circuit board. The bonding wire is packaged inside the package body, and the package body uses a magnetic material. For example, the magnetic material is a liquid magnetic material, and the bonding wire is packaged through dispensing by using the liquid magnetic material, to form the package body that uses the magnetic material. A type of the magnetic material is not limited in this application. A person skilled in the art can design the type of the magnetic material based on an actual requirement.

In this embodiment, the pads on the second circuit layer are connected by using the bonding wire, and a surface of the second circuit layer is the package body that uses the magnetic material, so that the package body and the bonding wire form a complete winding of a magnetic component (such as a transformer or an inductor). This can prevent an excessive current inside the electronic component package body, thereby helping improve reliability of the electronic device. In addition, the package body is seamlessly connected to the first circuit layer, to facilitate heat dissipation of each electronic component in the substrate, thereby improving heat dissipation performance of the electronic component package body.

According to a second aspect, this application further provides an electronic component assembly structure. The electronic component assembly structure includes an electronic component package body, a circuit board, and a solder joint soldered between the electronic component package body and the circuit board. The electronic component package body includes a substrate, an electronic component, and a pin. The electronic component is packaged inside the substrate, and the pin is electrically connected to the electronic component. A groove is disposed on a side that is of the pin and that is away from the electronic component. The groove is recessed from a bottom surface of the pin to a side of the electronic component. The solder joint is embedded in the groove. The groove does not penetrate the pin. It may be understood that pins are disposed at intervals relative to an exposed surface of a first circuit layer, and are connected to each other as a whole on a side close to the substrate. For example, a plurality of sub-pins separated by grooves use a same electrical network.

In this embodiment, a groove is disposed on a side that is of a single pin and that is away from the substrate, and the solder joint is embedded in the groove. This not only increases an exposed surface area of the single pin, but also enhances soldering strength of the pin in a three-dimensional direction, thereby improving reliability of soldering between the electronic component package body and the circuit board. Therefore, reliability of the electronic component assembly structure is improved. A width, a depth, a quantity, or the like of any groove is not limited in this application.

According to a third aspect, this application further provides an electronic device. The electronic device includes a housing and the electronic component assembly structure provided in the first aspect or the second aspect. The electronic component assembly structure is mounted on the housing.

In this embodiment, the electronic device includes the electronic component assembly structure provided in the first aspect or the second aspect. In the electronic component assembly structure, the electronic component package body and the circuit board have soldering areas of different dimensions, thereby improving reliability of secondary soldering of the electronic component assembly structure. Therefore, reliability of the electronic device is improved.

According to a fourth aspect, this application further provides an electronic component package body. The electronic component package body includes a substrate, an electronic component, and a pin. The electronic component is packaged inside the substrate. The pin is electrically connected to the electronic component, and a partial structure of the pin is exposed relative to the substrate, for soldering to a circuit board. For example, the substrate includes a packaging layer and a first circuit layer. The electronic component is packaged inside the packaging layer. The first circuit layer and the packaging layer are stacked. The first circuit layer has a first surface and a second surface that are disposed opposite to each other. The first surface is located between the packaging layer and the second surface. The first circuit layer includes a plurality of pins that are disposed at intervals. The plurality of pins are electrically connected to the electronic component.

Each pin includes a first part and a second part connected to the first part. The first part is embedded in the first circuit layer. The second part protrudes from the second surface. It may be understood that the second surface is a bottom surface of the electronic component package body, and the electronic component package body provides the pin from the bottom surface. The second part includes a bottom surface and a side surface. The bottom surface is an outer surface that is of the pin and that is away from the packaging layer, and the side surface is located between the bottom surface and the second surface. It may be understood that both the bottom surface and the side surface are exposed relative to the second surface. Both the bottom surface and the side surface are used for soldering with solder.

In this embodiment, the pin protrudes from the substrate, so that a part of the pin soldered to the circuit board is a three-dimensional pin. The pin has soldering areas of different dimensions, and a solder joint can be connected to not only the bottom surface of the pin but also the side surface of the pin, thereby increasing a soldering area of the pin, enhancing soldering strength of the pin in different dimensions, and improving reliability of soldering between the electronic component package body and the circuit board.

In some possible implementations, there are a plurality of pins, and the plurality of pins are disposed at intervals. A side surface of at least one of the pins includes an inclined surface. For example, the second part of the pin may be a stepped structure. Alternatively, a side surface of at least one of the pins includes a stepped surface. For example, the second part of the pin may be a stepped structure. Alternatively, a second part of at least one of the pins includes a curved surface. For example, the second part of the pin is a circular truncated cone.

In this embodiment, the side surface of the second part includes an inclined surface, a stepped surface, or a curved surface, so that on a basis that a height of the second part is the same, a surface area of the side surface of the second part is enlarged to further increase the soldering area of the pin, thereby improving reliability of soldering between the electronic component package body and the circuit board.

In some possible implementations, an area of the bottom surface is greater than an area of a cross section that is of the pin and that is along a surface of the substrate. That is, the area of the bottom surface is greater than an area of a cross section that is of the pin and that is along the second surface.

In this embodiment, the area of the bottom surface of the pin is greater than the area of the cross section that is of the pin and that is along the second surface, so that after the electronic component package body is soldered to the circuit board, the solder joint and the pin may form an interlocking force in a vertical direction, to further improve strength of the solder joint in a thickness direction of the electronic component package body, thereby avoiding a failure of the solder joint caused by long-term vibration of the electronic component, and improving reliability of an electronic device.

In some possible implementations, a material used for the first part is the same as a main material used for the second part. For example, main materials used for the first part and the second part may be, but are not limited to, copper, aluminum, or gold. It may be understood that the material used for the first part that is of the pin and that is embedded in the first circuit layer is not remelted in a soldering process, to ensure reliability of a circuit of the electronic component package body. The material used for the first part is the same as the main material used for the second part. That is, neither the first part nor the second part of the pin is remelted.

In this embodiment, the main materials used for the first part and the second part of the pin are different from a material used for the solder joint. The first part and the second part of the pin are not remelted in a process of soldering the electronic component package body to the circuit board, and shapes of the first part and the second part are substantially unchanged, to improve soldering reliability of the electronic device.

In some possible implementations, a groove is disposed on a side that is of at least one of the pins and that is away from the substrate. That is, a groove is disposed on a side that is of the pin and that faces the circuit board. The groove is recessed from a bottom surface of the pin to a side of the substrate.

In this embodiment, a groove is disposed on a side that is of a single pin and that is away from the substrate, thereby increasing an exposed surface area of the single pin, and further increasing a soldering area of the single pin. The groove may be filled with solder when the electronic component package body is soldered, thereby further improving reliability of soldering between the electronic component package body and the circuit board. A width, a depth, a quantity, or the like of any groove is not limited in this application.

In some possible implementations, a side that is of the substrate and that is away from the pin includes a first pad and a second pad. The first pad and the second pad are disposed at intervals. An electronic component assembly structure further includes a bonding wire and a package body. The bonding wire is electrically connected between the first pad and the second pad. The package body is located on a side that is of the substrate and that is away from the circuit board. The bonding wire is packaged inside the package body, and the package body uses a magnetic material.

In this embodiment, the pads on the side that is of the substrate and that is away from the pin are connected by using the bonding wire, and are embedded in the package body that uses the magnetic material, so that the package body and the bonding wire form a complete winding of a magnetic component (such as a transformer or an inductor). This can prevent an excessive current inside the electronic component package body, thereby helping improve reliability of the electronic device. In addition, the package body is seamlessly connected to the first circuit layer, to facilitate heat dissipation of each electronic component in the substrate, thereby improving heat dissipation performance of the electronic component package body.

According to a fifth aspect, this application further provides an electronic component package body. The electronic component package body includes a substrate, an electronic component, and a pin. The electronic component is packaged inside the substrate, and the pin is electrically connected to the electronic component. A groove is disposed on a side that is of the pin and that is away from the electronic component. The groove is recessed from a bottom surface of the pin to a side of the electronic component. The groove is configured to be filled with solder. The groove does not penetrate the pin. It may be understood that pins are disposed at intervals relative to an exposed surface of a first circuit layer, and are connected to each other as a whole on a side close to the substrate. For example, a plurality of sub-pins separated by grooves use a same electrical network.

In this embodiment, a groove is disposed on a side that is of a single pin and that is away from the substrate. This not only increases an exposed surface area of the single pin, but also enhances soldering strength of the pin in a three-dimensional direction, thereby improving reliability of soldering between the electronic component package body and another part. A width, a depth, a quantity, or the like of any groove is not limited in this application.

DESCRIPTION OF EMBODIMENTS

The following describes embodiments of this application with reference to the accompanying drawings in the embodiments of this application.

This application provides an electronic device. The electronic device includes a housing and an electronic component assembly structure. The electronic component assembly structure is mounted on the housing. The electronic device may be a product such as a mobile phone, a tablet computer, a notebook computer, a vehicle-mounted device, a wearable device, a drone, or a router. The electronic device may alternatively be a device such as a power supply module, a base station transmitting a communication signal, or a network switching device. In this embodiment, an example in which the electronic device is a vehicle-mounted device is used for description.

Figure 1:
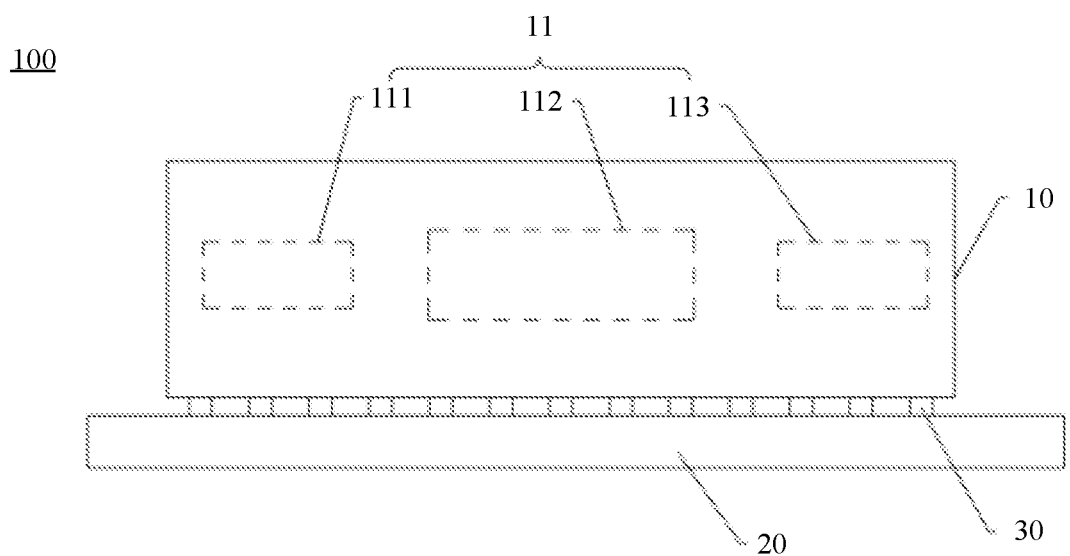
FIG. 1 is a schematic diagram of a partial structure of an electronic component assembly structure according to an embodiment of this application.

FIG. 1 is a schematic diagram of a partial structure of an electronic component assembly structure 100 according to an embodiment of this application. As shown in FIG. 1, the electronic component assembly structure 100 includes an electronic component package body 10, a circuit board 20, and a solder joint 30 connected between the electronic component package body 10 and the circuit board 20. The electronic component package body 10 includes an electronic component 11. The electronic component 11 may be an active component such as a chip, or may be a passive component such as a capacitor, an inductor, or a resistor. A person skilled in the art can select a type and a quantity of the electronic component 11 based on an actual requirement. This is not limited in this application. The electronic component package body 10 is a carrier for packaging the electronic component 11 and provides functions such as electrical connection, protection, support, heat dissipation, and assembly for the packaged electronic component 11.

In some embodiments, there are a plurality of electronic components 11. As shown in FIG. 1, the electronic component 11 includes, for example, a first component 111, a second component 112, and a third component 113. The second component 112 is spaced between the first component 111 and the third component 113. In some possible implementations, the second component 112 is a chip, the first component 111 is a resistor, and the third component 113 is a capacitor.

In this embodiment of this application, the electronic component package body 10 may use a system in package (SiP), a power supply-in-package (PSiP), or an embedded chip package (ECP) substrate. The system in package is to integrate multi-functional electronic components such as a processor, a memory, and a power management chip into one package body to implement a basically complete function. The embedded chip package substrate may be understood as a substrate structure in which a chip is mounted inside the substrate, then the chip is packaged by using a packaging material, and interconnection is implemented by using a copper hole, a copper column, or the like. In this embodiment, an example in which the electronic component package body 10 uses an ECP substrate is used for specific description.

The circuit board 20 may be understood as a carrier of the electronic component package body 10, and can carry the electronic component package body 10 and be assembled with the electronic component package body 10. The circuit board 20 is electrically connected to the electronic component package body 10 through soldering by using the solder joint 30, thereby implementing electrical interconnection with the electronic component package body 10. In this embodiment of this application, an example in which the electronic component package body 10 is mounted on the circuit board 20 is used for description. In another embodiment, the electronic component package body 10 may alternatively be mounted on another structure. This is not limited in this application.

It should be noted that FIG. 1 is merely intended to schematically describe a connection relationship between the circuit board 20 and the electronic component package body 10, and is not intended to specifically limit a connection position, a specific structure, and a quantity of each device. The structure illustrated in this embodiment of this application does not constitute a specific limitation on the electronic component assembly structure 100. In some other embodiments of this application, the electronic component assembly structure 100 may include more components than those shown in the figure, or combine some components, or split some components, or have different component arrangements. The components shown in the figure may be implemented by using hardware, software, or a combination of software and hardware.

In this embodiment, the electronic component package body and the circuit board are soldered by using a LGA. The land grid array is a type of surface-mount packaging, and reliability of soldering between the electronic component package body and the circuit board is relatively poor. In a scenario of long-term mechanical vibration or impact of a temperature change, an electronic device has a risk of an electrical failure caused by unsteady soldering. For example, a pin of the electronic component package body is flush with an outer surface of the electronic component package body, and a surface of the circuit board is attached to the surface of the electronic component package body to connect the pin of the electronic component package body and a corresponding pin on the circuit board. In a long-term mechanical vibration process of the electronic device, a fatigue failure of the solder joint between the electronic component package body and the circuit board causes the solder joint to be broken, thereby affecting reliability of the electronic device.

Therefore, this application provides an electronic component package body 10. A pin of the electronic component package body 10 has soldering areas of different dimensions, thereby improving reliability of soldering between the electronic component package body 10 and the circuit board 20, reducing a risk of a soldering failure of the electronic component package body 10 and the circuit board 20 caused by long-term vibration of the electronic component assembly structure 100, and effectively improving board-level reliability of the electronic component assembly structure 100. The following mainly uses four embodiments to specifically describe the electronic component assembly structure 100 and the corresponding electronic component package body 10 that are provided in this application.

Figure 2:
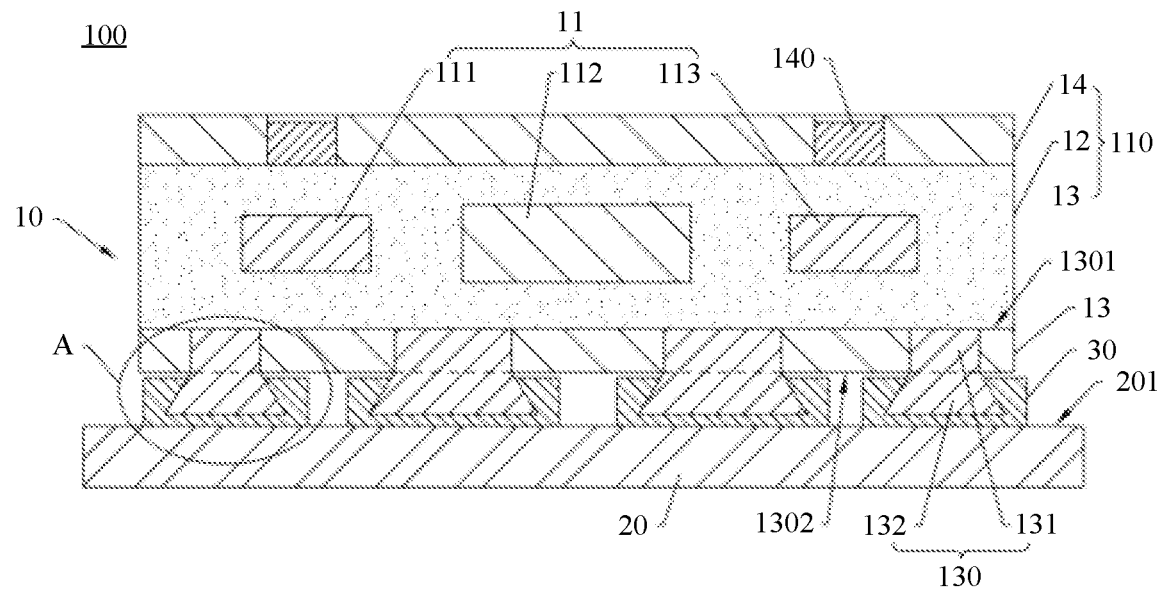
FIG. 2 is a schematic diagram of a partial cross section of an electronic component assembly structure according to Embodiment 1 of this application.

FIG. 2 is a schematic diagram of a partial cross section of an electronic component assembly structure 100 according to Embodiment 1 of this application. An electronic component package body 10 is mounted on a mounting surface 201 of a circuit board 20. A solder joint 30 is configured to implement electrical connection between the electronic component package body 10 and the circuit board 20. For example, the electronic component package body 10 includes a substrate 110, an electronic component 11, and a pin 130. The electronic component 11 is packaged inside the substrate 110. The pin 130 is electrically connected to the electronic component 11, and a partial structure of the pin 130 is exposed relative to the substrate 110, for soldering to the circuit board 20.

For example, the substrate 110 includes a packaging layer 12 and a first circuit layer 13. The electronic component 11 is packaged inside the packaging layer 12. The first circuit layer 13 and the packaging layer 12 are stacked. The first circuit layer 13 has a first surface 1301 and a second surface 1302 that are disposed opposite to each other. The first surface 1301 is located between the packaging layer 12 and the second surface 1302. The mounting surface 201 faces the second surface 1302, and the solder joint 30 is connected between the pin 130 and the circuit board 20. It may be understood that the second surface 1302 is an outer surface of the substrate 110. As shown in FIG. 2, in this embodiment, an example in which the first surface 1301 of the first circuit layer 13 is in contact with the packaging layer 12 is used for description. In another embodiment, another structure such as a circuit layer may be further disposed between the packaging layer 12 and the first circuit layer 13. This is not limited in this application. A person skilled in the art can design a structure between the first circuit layer 13 and the packaging layer 12 based on an actual requirement.

There are a plurality of pins 130, and the plurality of pins 130 are disposed at intervals. The plurality of pins 130 use conducting materials, and are spaced by insulating materials. The insulating material may be, but is not limited to, a liquid photoimageable solder mask (green oil). The plurality of pins 130 are electrically connected to the electronic component 11, and are electrically connected to the circuit board 20 by using a plurality of solder joints 30. For example, a quantity of pins 130 corresponds to a quantity of solder joints 30. When the electronic component package body 10 is assembled on the circuit board 20, electrical connection is implemented by using the pin 130 and the solder joint 30. A signal generated by a working module electrically connected to the circuit board 20 is transmitted to the electronic component package body 10 by sequentially using the circuit board 20 and the pin 130. Alternatively, a signal generated during processing in the electronic component package body 10 is transmitted to a corresponding working module by sequentially using the pin 130, the solder joint 30, and the circuit board 20, to implement communication between the electronic component package body 10 and the corresponding working module.

Figure 3:
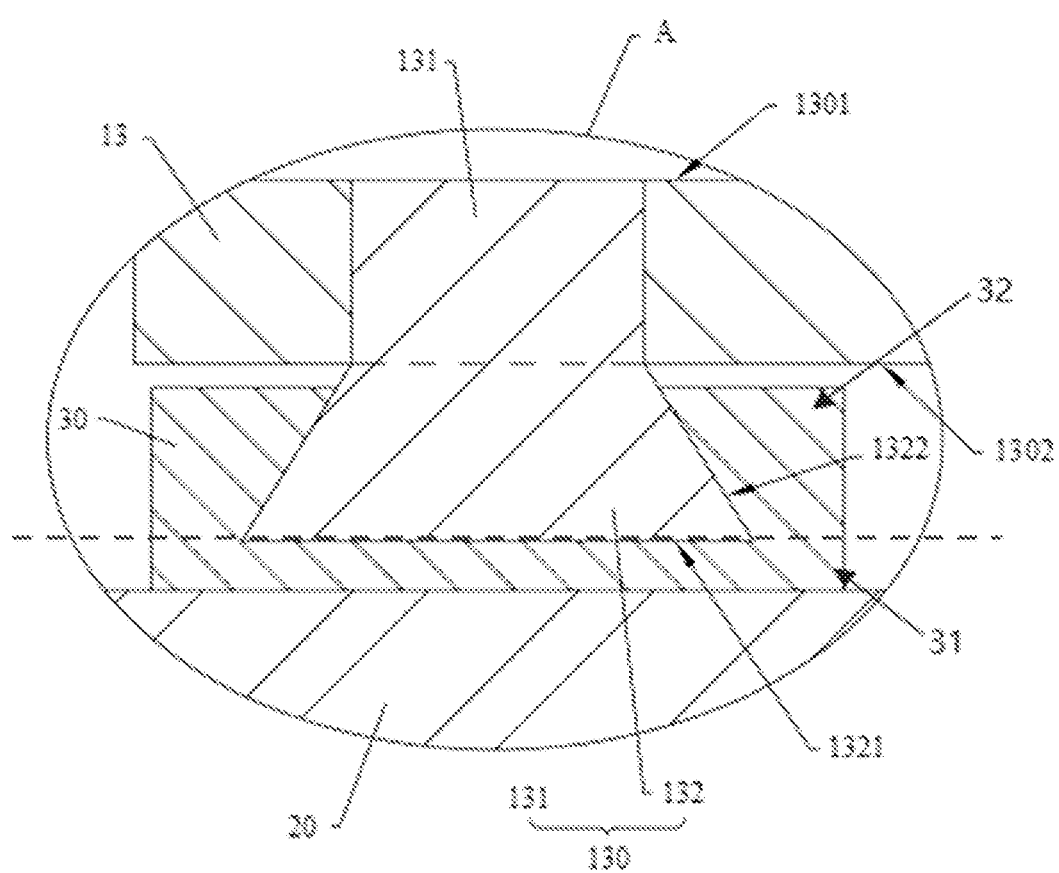
FIG. 3 is a schematic diagram of a structure of a part A shown in FIG. 2 in a first implementation.

Refer to FIG. 2 and FIG. 3. FIG. 3 is a schematic diagram of a structure of a part A shown in FIG. 2 in a first implementation. The pin 130 includes a first part 131 and a second part 132 connected to the first part 131. The first part 131 is embedded in the first circuit layer 13, and the second part 132 protrudes from the substrate 110. For example, the first part 131 is directly connected to the second part 132. In another embodiment, the first part 131 may alternatively be indirectly connected to the second part 132. This is not limited in this application. It may be understood that each pin 130 extends from the first surface 1301 to the second surface 1302, and protrudes from the second surface 1302. That is, a partial structure of the pin 130 protrudes from the second surface 1302 (an outer surface of the electronic component package body 10), to form the pin 130 of a three-dimensional structure. It may be understood that the second surface 1302 is a bottom surface of the electronic component package body 10, and the electronic component package body 10 provided in this application provides the pin from the bottom surface.

The second part 132 includes a bottom surface 1321 and a side surface 1322. The bottom surface 1321 is an outer surface that is of the pin 130 and that is away from the packaging layer 12, and the side surface 1322 is located between the bottom surface 1321 and the second surface 1302. It may be understood that both the bottom surface 1321 and the side surface 1322 are exposed relative to the second surface 1302. When the electronic component package body 10 is placed on a reference plane, the bottom surface 1321 is in contact with the reference plane or parallel to the reference plane, and the side surface 1322 is connected between the second surface 1302 and the reference plane. The side surface 1322 may be a curved surface, or may be a flat surface. This is not limited in this application.

The solder joint 30 surrounds the second part 132 that is of the pin 130 and that protrudes from the second surface 1302. That is, the solder joint 30 surrounds the bottom surface 1321 and the side surface 1322 of the second part 132. As shown in FIG. 3, the solder joint 30 is located not only on the bottom surface 1321 of the pin 130 but also on the side surface 1322 of the second part 132, to surround the second part 132.

In this embodiment, the pin 130 protrudes from the substrate 110, so that a part of the pin 130 soldered to the circuit board 20 is a three-dimensional pin 130. The pin 130 has soldering areas of different dimensions, and the solder joint 30 can be connected to not only the bottom surface 1321 of the pin 130 but also the side surface 1322 of the pin 130, thereby increasing a soldering area of the pin 130, enhancing soldering strength of the pin 130 in different dimensions, and improving reliability of soldering between the electronic component package body 10 and the circuit board 20. When the electronic component package body 10 and the circuit board 20 are assembled and soldered, both a bottom wall of the pin 130 and a side wall of the protruding pin 130 may be covered with tin, so that the solder joint 30 surrounds the bottom surface 1321 and the side surface 1322 of the pin 130.

It may be understood that the first circuit layer 13 further includes insulating materials, and the insulating materials are spaced between the plurality of pins 130. In some embodiments, the part that is of the pin 130 and that is embedded in the first circuit layer 13 and the part that is of the pin 130 and that protrudes from the first circuit layer 13 may be integrally formed, or may be formed in steps. This application does not limit a technology for forming the pin 130 in the electronic component package body 10, which may be an etching technology or a laser soldering technology. A person skilled in the art can design the technology based on an actual requirement. For example, the first circuit layer 13 is first etched to form a patterned first circuit layer 13, and after the patterned first circuit layer 13 is filled with the conducting material, the conducting material is further electroplated along a filled conducting material structure, to form, in steps, the pin 130 that protrudes from the first circuit layer 13. Alternatively, the conducting material in the patterned first circuit layer 13 is covered by a photoresist, and a partial structure of the insulating material in the patterned first circuit layer 13 is etched by using a mask, to integrally form the pin 130 that protrudes from the first circuit layer 13.

In some embodiments, a material used for the solder joint 30 includes tin, and the material used for the solder joint 30 is different from a material used for the second part 132. In a process of soldering the electronic component package body 10 to the circuit board 20, the solder joint 30 is remelted to wrap the second part 132. In this case, the second part 132 is not remelted. That is, a shape of the second part 132 is substantially unchanged in an assembling process, so that the solder joint 30 effectively surrounds the second part 132, thereby improving reliability of soldering between the electronic component package body 10 and the circuit board 20. Remelting is a process of secondary melting of a metal or an alloy.

In some embodiments, a material used for the first part 131 is the same as a main material used for the second part 132. For example, materials used for the first part 131 and the second part 132 may be, but are not limited to, copper, aluminum, or gold. It may be understood that main portions of the first part 131 and the second part 132 of the pin 130 are not to be remelted in a secondary assembly process.

In this embodiment, main materials used for the first part 131 and the second part 132 of the pin 130 are different from the material used for the solder joint 30. Main structures of the first part 131 and the second part 132 of the pin 130 are not remelted in the process of soldering the electronic component package body 10 to the circuit board 20, and shapes of the first part 131 and the second part 132 are substantially unchanged, to improve soldering reliability of the electronic component assembly structure 100. However, in a conventional technology, when soldering between the electronic component package body 10 and the circuit board 20 is implemented by using a ball grid array (BGA), a solder ball is remelted and deformed in the soldering process.

Further refer to FIG. 2. In some embodiments, a side that is of the substrate 110 and that is away from the circuit board 20 includes a pad 140. For example, the substrate 110 further includes a second circuit layer 14 stacked with the packaging layer 12. It may be understood that the second circuit layer 14 is disposed on atop surface of the electronic component package body 10, and the first circuit layer 13 is disposed on the bottom surface of the electronic component package body 10. For example, the second circuit layer 14 includes a plurality of pads 140 disposed for electrical connection. There may be a difference between pattern designs of the second circuit layer 14 and the first circuit layer 13. In other words, the pattern designs of the first circuit layer 13 and the second circuit layer 14 may be different. This is not strictly limited in this embodiment of this application. The pattern designs of the first circuit layer 13 and the second circuit layer 14 may be set based on a requirement of the electronic component 11 packaged in the electronic component package body 10. For example, the pin 130 of the first circuit layer 13 and the pad 140 of the second circuit layer 14 may be copper.

In this embodiment, the electronic component package body 10 has the first circuit layer 13 and the second circuit layer 14 that are disposed opposite to each other, so that both surfaces (the top surface and the bottom surface) of the electronic component package body 10 have circuit layers capable of electrical connection. This can provide a good foundation for double-sided interconnection of the electronic component 11 packaged in the electronic component package body 10, and facilitate realization of a shortest interconnection path and a thin package of the packaging layer 12 in a limited space layout, thereby having high practicability and high reliability.

Further refer to FIG. 3. In some embodiments, a side surface 1322 of at least one of the plurality of pins 130 includes an inclined surface. For example, all side surfaces 1322 of the plurality of pins 130 include inclined surfaces. The second part 132 of the pin 130 may be a trapezoidal body or a truncated pyramid. In another embodiment, the side surface 1322 of the pin 130 is a curved surface, and a tangent plane of a side surface 1322 of at least one of the plurality of pins 130 is not perpendicular to the bottom surface 1321. If a plane and a curved surface have only one intersection point, the plane is a tangent plane of the curved surface. For example, the second part 132 of the pin 130 may be a circular truncated cone. As shown in FIG. 3, a cross section of the second part 132 of the pin 130 is a trapezoid in a thickness direction perpendicular to the electronic component package body 10. In this case, the second part 132 of the pin 130 may be a circular truncated cone or a trapezoidal body.

In this embodiment, a cross-sectional shape of the second part 132 may be a trapezoid, and the second part 132 may be a trapezoidal body, a truncated pyramid, or a circular truncated cone, so that on a basis that a height of the second part 132 is the same, a surface area of the side surface 1322 of the second part 132 is enlarged to further increase the soldering area of the pin 130, thereby improving reliability of soldering between the electronic component package body 10 and the circuit board 20. A tilt rate of the side surface 1322 of the pin 130 is not limited in this application. A person skilled in the art can reasonably design a tilt angle of the side surface 1322 of the pin 130 based on an area of the second surface 1302 and a gap between the pins 130.

Further refer to FIG. 3. In some embodiments, an area of the bottom surface 1321 is greater than an area of a cross section that is of the pin 130 and that is along a surface (the second surface 1302) of the substrate 110. For example, in a trapezoidal cross-sectional view shown in FIG. 3, a length of a lower side of the trapezoid is greater than a length of an upper side of the trapezoid. When the second part 132 is a circular truncated cone, an area of a lower surface of the circular truncated cone is greater than an area of an upper surface of the circular truncated cone.

The solder joint 30 includes a first segment 31 and a second segment 32 connected to the first segment 31. The first segment 31 is connected between the bottom surface 1321 of the pin 130 and the circuit board 20, and the second segment 32 is disposed around a periphery of the side surface 1322 of the pin 130. A projection of the second segment 32 on the circuit board 20 partially overlaps a projection of the bottom surface 1321 of the pin 130 on the circuit board 20. It may be understood that, after the electronic component package body 10 is soldered to the circuit board 20, the solder joint 30 that connects the electronic component package body 10 and the circuit board 20 in the electronic component assembly structure 100 forms an interlocking structure with the pin 130.

In this embodiment, the area of the bottom surface 1321 of the pin 130 is greater than the area of the cross section that is of the pin 130 and that is along the second surface 1302, so that after the electronic component package body 10 is soldered to the circuit board 20, the solder joint 30 and the pin 130 may form an interlocking force in a vertical direction, to further improve strength of the solder joint 30 in a thickness direction of the electronic component package body 10, thereby avoiding a failure of the solder joint caused by long-term vibration of the electronic component 11, and improving reliability of the electronic component assembly structure 100.

Figure 4:
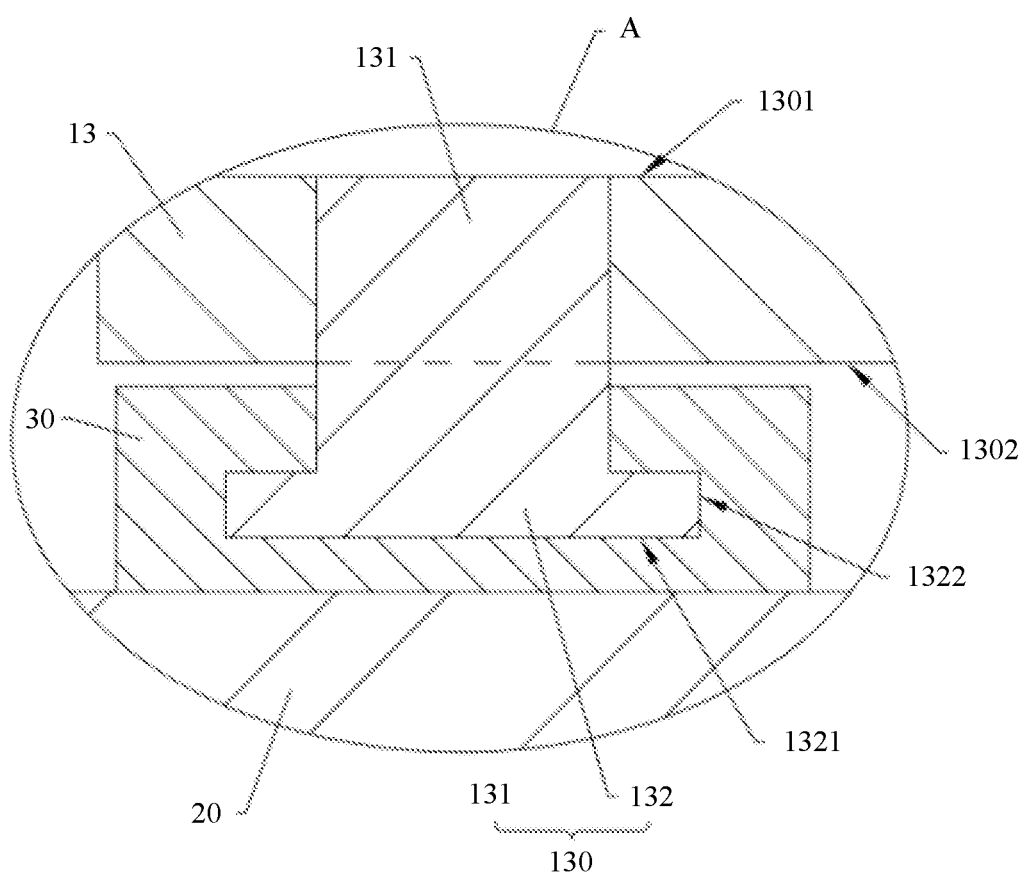
FIG. 4 is a schematic diagram of a structure of a part A shown in FIG. 2 in a second implementation.

FIG. 4 is a schematic diagram of a structure of a part A shown in FIG. 2 in a second implementation. In this implementation, a side surface 1322 of at least one of the plurality of pins 130 is a stepped surface. For example, all side surfaces 1322 of the plurality of pins 130 are stepped surfaces. As shown in FIG. 4, a cross section of the second part 132 of the pin 130 is a stepped shape in a thickness direction perpendicular to the electronic component package body 10. In this case, the second part 132 of the pin 130 may be a shape in which at least two trapezoidal bodies are stacked, or may be a shape in which two circular truncated cones are stacked. For example, in a stepped cross-sectional view shown in FIG. 4, a step is upward, and the solder joint 30 between the electronic component package body 10 and the circuit board 20 forms an interlocking structure with the pin 130, thereby improving reliability of soldering between the electronic component package body 10 and the circuit board 20.

It may be understood that FIG. 3 and FIG. 4 separately list schematic diagrams of cross sections of the pin 130 that protrudes from the first circuit layer 13 in different implementations. A cross-sectional shape of the second part 132 of the pin 130 may be a stepped shape, so that an area of the side surface 1322 of the second part 132 is enlarged to further increase the soldering area of the pin 130, thereby improving reliability of soldering between the electronic component package body 10 and the circuit board 20. A specific shape of the second part 132 of the pin 130 is not limited in this embodiment of this application. A person skilled in the art can design the specific shape based on an actual requirement.

Figure 5:
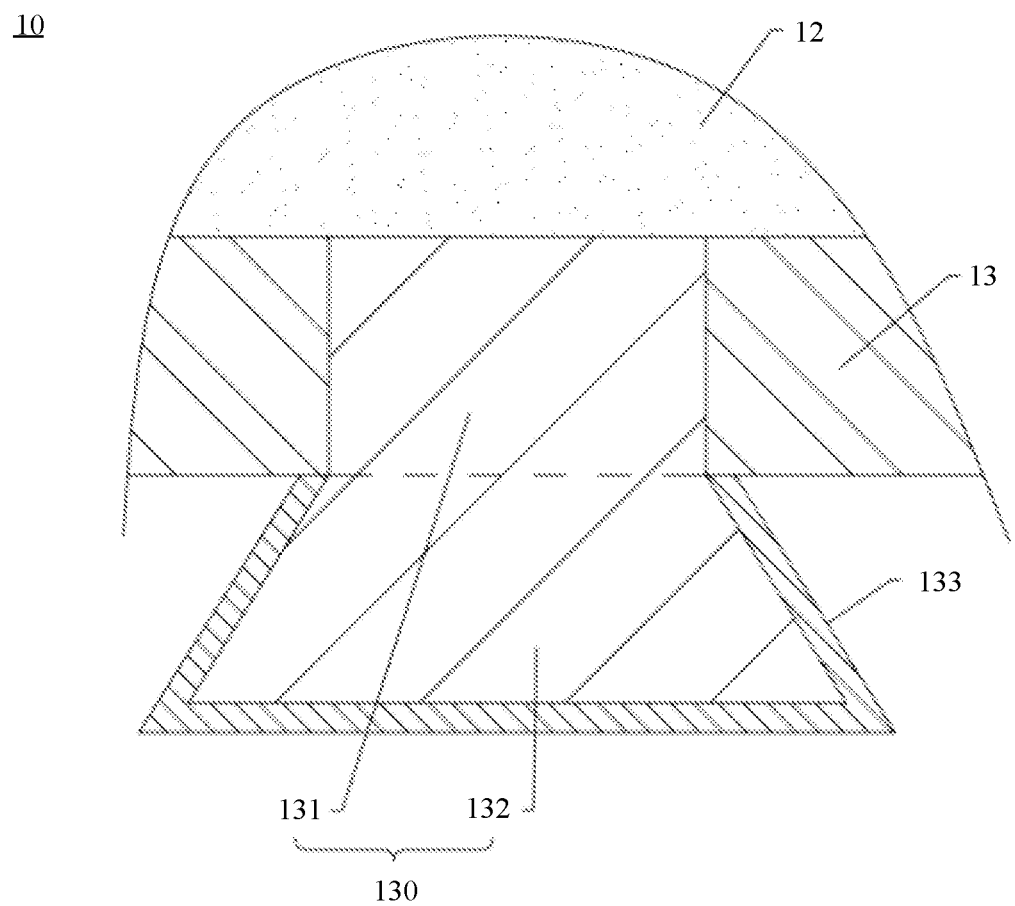
FIG. 5 is a schematic diagram of a partial structure of an electronic component package body shown in FIG. 2 in a third implementation.

FIG. 5 is a schematic diagram of a partial structure of the electronic component package body 10 shown in FIG. 2 in a third implementation. Specifically, the structure of the electronic component package body 10 shown in this implementation may be combined with the structure of any electronic component package body 10 shown in FIG. 3 and FIG. 4.

In this implementation, the pin 130 further includes a protective layer 133. The protective layer 133 is located on an outer surface of the second part 132. For example, the protective layer 133 wraps the outer surface of the second part 132 through electroplating. Oxidation resistance of a material used for the protective layer 133 is greater than oxidation resistance of the material used for the second part 132. For example, the material used for the second part 132 includes, but is not limited to, copper or aluminum. The material used for the protective layer 133 includes, but is not limited to, tin or gold.

In this embodiment, the pin 130 further includes the protective layer 133 that wraps the second part 132, and oxidation resistance of the protective layer 133 is greater than oxidation resistance of the second part 132. The protective layer 133 is configured to protect the second part 132 and avoid oxidation of the second part 132, thereby further improving reliability of the electronic component package body 10.

Figure 6:
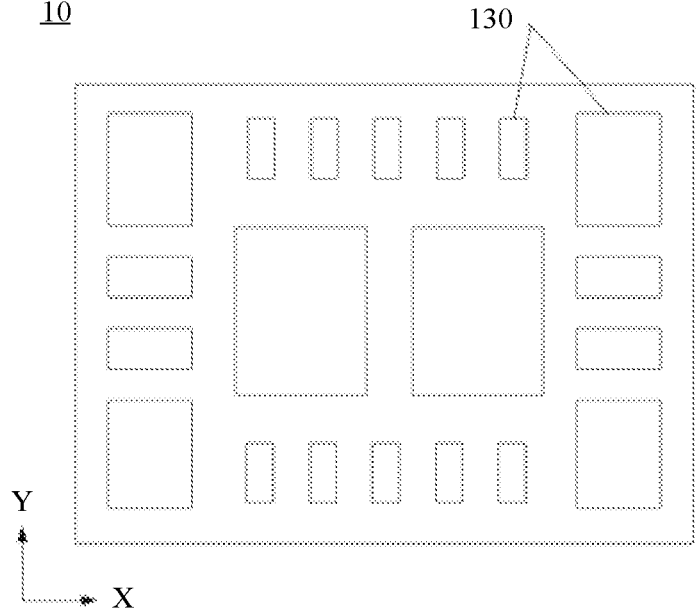
FIG. 6 is a top view of an electronic component package body shown in FIG. 2.

FIG. 6 is a top view of the electronic component package body 10 shown in FIG. 2. Shapes of the plurality of pins 130 may be the same or different. This is not limited in this application. As shown in FIG. 6, an area of a bottom surface 1321 of a pin 130 located in a middle part of the electronic component package body 10 is greater than an area of a bottom surface 1321 of an edge pin 130. A person skilled in the art can design a gap between the pins 130 based on an actual situation, to avoid mutual interference between adjacent pins 130. An arrangement manner of the plurality of pins 130 is not limited in this application, and may be symmetrical arrangement or asymmetrical arrangement. For example, the plurality of pins 130 are symmetrically arranged along a length direction X and a width direction Y of the electronic component package body 10. In another implementation, the plurality of pins 130 may alternatively be asymmetrically arranged. This is not limited in this application.

The shapes of the pins 130 are not limited in this application, and the shapes of the plurality of pins 130 may be the same or different. For example, as shown in FIG. 6, the shapes of the pins 130 are rectangles in the top view. In another embodiment, the shapes of the pins 130 in the top view may alternatively be other geometric shapes, for example, circles. This is not limited in this application.

Figure 7:
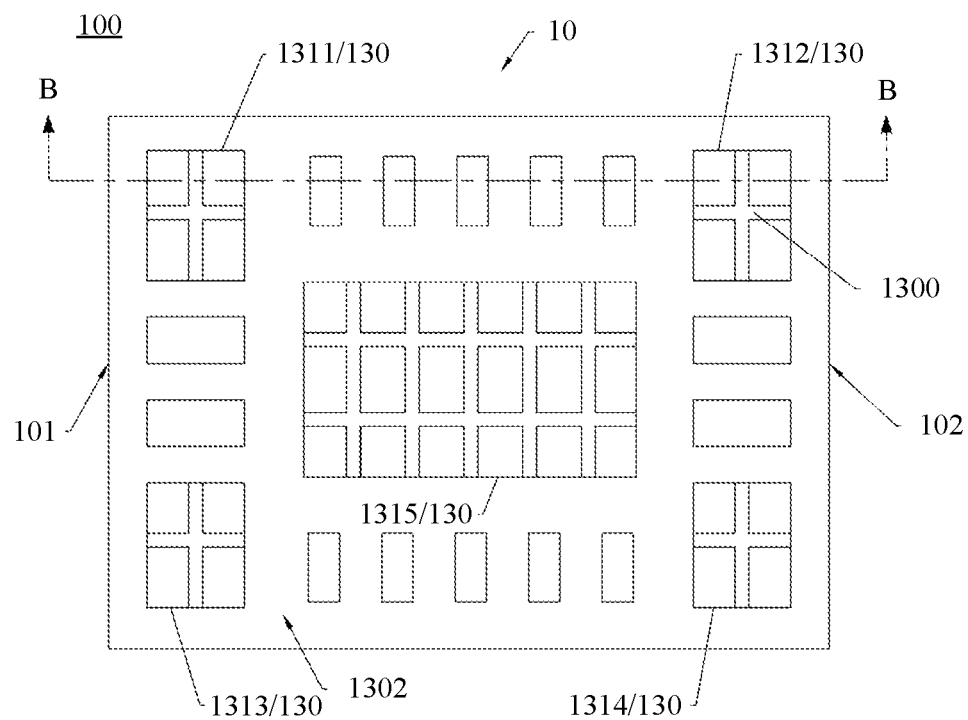
FIG. 7 is a top view of an electronic component assembly structure according to Embodiment 2 of this application.
Figure 8:
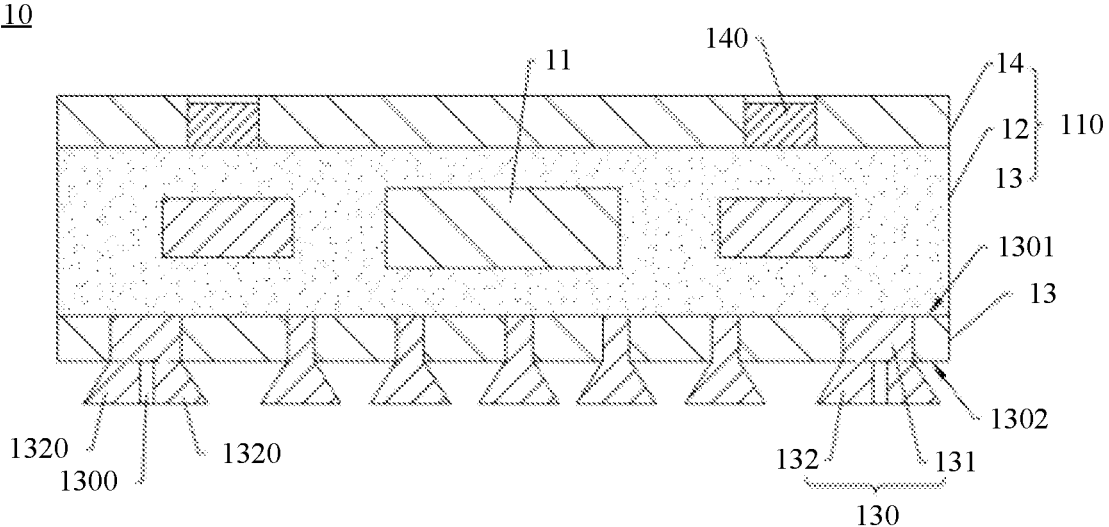
FIG. 8 is a schematic diagram of a partial cross section that is of an electronic component package body shown in FIG. 7 and that is along B-B.

Refer to FIG. 7 and FIG. 8. FIG. 7 is a top view of an electronic component assembly structure 100 according to Embodiment 2 of this application. FIG. 8 is a schematic diagram of a partial cross section that is of an electronic component package body 10 shown in FIG. 7 and that is along B-B. The electronic component assembly structure 100 shown in FIG. 7 does not show a solder point or a circuit board.

The following mainly describes differences between this embodiment and Embodiment 1, and most content of this embodiment that is the same as the content of Embodiment 1 is not described again. For example, the electronic component package body 10 includes a substrate 110, an electronic component 11 packaged inside the substrate 110, and a pin 130 electrically connected to the electronic component 11. The pin 130 protrudes from a surface of the substrate 110. For example, a part that is of the pin 130 and that protrudes from the substrate 110 may be a circular truncated cone or a trapezoidal body.

In this embodiment, a groove 1300 is disposed on a side that is of at least one of the pins 130 and that is away from the substrate 110. The groove 1300 is recessed from a bottom surface 1321 of the pin 130 to a side of the substrate 110. That is, a groove 1300 is disposed on a side that is of at least one of the pins 130 and that faces the circuit board. It may be understood that the groove 1300 does not penetrate the pin 130. For example, there are a plurality of grooves 1300. A second part 132 of at least one of the pins 130 includes a plurality of sub-pins 1320. The plurality of sub-pins 1320 are disposed at intervals, and the plurality of sub-pins 1320 are all connected to a first part 131. The grooves 1300 divide the second part 132 into a plurality of sub-pins 1320 that are disposed at intervals. For example, the plurality of sub-pins 1320 are symmetrically arranged. As shown in FIG. 7, the plurality of sub-pins 1320 are arranged in a matrix form. A gap between any two adjacent sub-pins 1320 is less than a gap between any two adjacent pins 130.

It may be understood that the plurality of sub-pins 1320 disposed at intervals in the pin 130 are disposed at intervals relative to an exposed surface of the substrate 110, and structures embedded in a first circuit layer 13 in the substrate 110 are connected to each other as a whole. That is, the plurality of sub-pins 1320 are the pin 130 having a same function. For example, the plurality of sub-pins 1320 use a same electrical network. As shown in FIG. 7, for example, the groove 1300 is recessed to the first part 131 of the pin 130. In another embodiment, the groove 1300 may alternatively be recessed to another depth. This is not limited in this application. When the electronic component package body 10 is mounted on the circuit board, the solder joint not only surrounds the bottom surface and a side surface of the pin 130, but also fills the groove 1300, thereby increasing a contact area between the solder joint and the pin 130. That is, when the electronic component assembly structure uses the electronic component package body provided in this embodiment, a partial structure of the solder joint is embedded in the groove 1300.

In this embodiment, a groove 1300 is disposed on a side that is of a single pin 130 and that is away from the substrate 110, thereby increasing an exposed surface area of the single pin 130, and further increasing a soldering area of the single pin 130. The groove 1300 may be filled with solder when the electronic component package body 10 is soldered, thereby further improving reliability of soldering between the electronic component package body 10 and the circuit board 20. A width, a depth, a quantity, or the like of any groove 1300 is not limited in this application. A person skilled in the art can design a size of the groove 1300 based on an actual requirement or a machine requirement. For example, in a method for preparing the electronic component package body 10, a second part 132 of a single pin 130 may be segmented, to divide the second part 132 of the single pin 130 into a plurality of sub-pins 1320 that are disposed at intervals. A segmentation method may be, but is not limited to, etching or a laser.

Further refer to FIG. 7. In some embodiments, the electronic component package body 10 has a first side surface 101 and a second side surface 102 that are disposed opposite to each other. A second surface 1302 is connected between the first side surface 101 and the second side surface 102. When the electronic component package body 10 is placed on a reference plane, the second surface 1302 is parallel to the reference plane, and both the first side surface 101 and the second side surface 102 are perpendicular to the reference plane.

The plurality of pins 130 include a first pin 1311 and a second pin 1312. The first pin 1311 is closest to the first side surface 101, the second pin 1312 is closest to the second side surface 102, and a plurality of sub-pins 1320 are disposed on both the first pin 1311 and the second pin 1312. It may be understood that both the first pin 1311 and the second pin 1312 are located at an edge of the electronic component package body 10.

In this embodiment, a possibility of a fatigue failure caused by vibration of the electronic component assembly structure 100 is relatively high for a pin 130 at an edge of the electronic component package body 10. Therefore, the pin 130 at the edge of the electronic component package body 10 is segmented to form a plurality of sub-pins 1320 that are disposed at intervals. This not only improves soldering reliability of the edge pin 130, but also avoids increasing costs by segmenting all pins 130. In another embodiment, the second part 132 of each pin 130 may alternatively have a plurality of sub-pins 1320 that are disposed at intervals. This is not limited in this application.

As shown in FIG. 7, for example, the electronic component package body 10 is substantially a rectangle. The plurality of pins 130 include the first pin 1311, the second pin 1312, a third pin 1313, and a fourth pin 1314. The first pin 1311, the second pin 1312, the third pin 1313, and the fourth pin 1314 are respectively located at four corners of the first circuit layer 13. In addition, a plurality of sub-pins 1320 are disposed on each of the first pin 1311, the second pin 1312, the third pin 1313, and the fourth pin 1314.

In this embodiment, pins 130 at four corners of the electronic component package body 10 have a relatively high risk of being shaken off, and a plurality of sub-pins 1320 that are disposed at intervals are disposed on each of the pins 130 at the four corners, to improve reliability of the electronic component assembly structure 100. As shown in FIG. 7, in some embodiments, the plurality of pins 130 further include a fifth pin 1315, the fifth pin 1315 is located in a middle area of the electronic component package body 10, and a plurality of sub-pins 1320 that are disposed at intervals are disposed on the fifth pin 1315.

Figure 9:
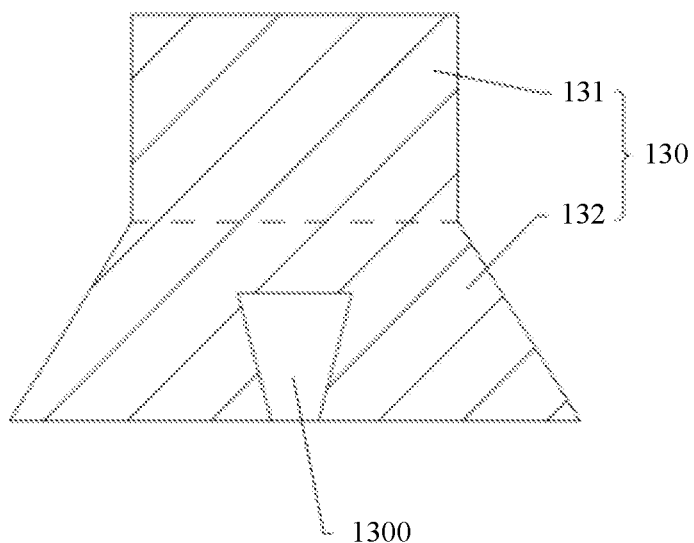
FIG. 9 is a schematic diagram of a partial cross section that is of a pin shown in FIG. 7 and that is along B-B in another implementation.

Refer to FIG. 7 and FIG. 9. FIG. 9 is a schematic diagram of a partial cross section that is of a pin 130 shown in FIG. 7 and that is along B-B in another implementation. In this implementation, a standard size of the groove 1300 gradually increases from an opening of the groove 1300 to a bottom surface of the groove 1300. It may be understood that an area of the opening of the groove 1300 is less than an area of the bottom surface of the groove 1300. As shown in FIG. 9, for example, a cross-sectional shape of the groove 1300 is an inverted trapezoid.

In this implementation, the standard size of the groove 1300 gradually increases from the opening of the groove 1300 to the bottom surface of the groove 1300. After the electronic component package body 10 is soldered to the circuit board 20, the solder joint that connects the electronic component package body 10 and the circuit board 20 in the electronic component assembly structure 100 forms an interlocking structure with the pin 130, to further improve strength of the solder joint in a thickness direction of the electronic component package body 10, thereby avoiding a failure of the solder joint caused by long-term vibration of the electronic component 11, and improving reliability of the electronic component assembly structure 100.

Figure 10:
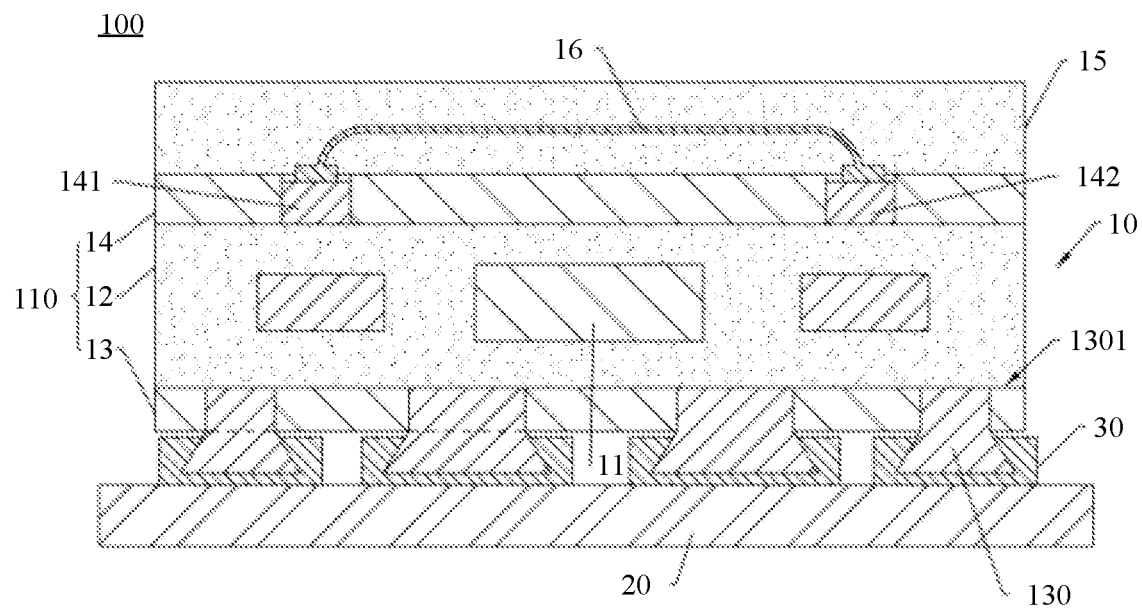
FIG. 10 is a schematic diagram of a partial cross section of an electronic component assembly structure according to Embodiment 3 of this application.

FIG. 10 is a schematic diagram of a partial cross section of an electronic component assembly structure 100 according to Embodiment 3 of this application. Specifically, the electronic component assembly structure 100 shown in this embodiment may be combined with the structure of any electronic component package body 10 shown in FIG. 2 to FIG. 9.

The following mainly describes differences between this embodiment and the foregoing embodiments, and most content of this embodiment that is the same as the content of the foregoing embodiments is not described again. The electronic component package body 10 includes a substrate 110, an electronic component 11 packaged inside the substrate 110, and a pin 130 electrically connected to the electronic component 11. The pin 130 protrudes from a surface of the substrate 110. For example, a part that is of the pin 130 and that protrudes from the substrate 110 may be a circular truncated cone or a trapezoidal body. For example, a groove 1300 is disposed on a side that is of at least one of the pins 130 and that is away from the substrate 110.

In this embodiment, a second circuit layer 14 in the substrate 110 includes a first pad 141 and a second pad 142. The first pad 141 and the second pad 142 are disposed at intervals. The electronic component package body 10 further includes a bonding wire 16. The bonding wire 16 is electrically connected between the first pad 141 and the second pad 142, to electrically connect the first pad 141 and the second pad 142. For example, the bonding wire 16 is electrically connected to a first component 111 and a second component 112, and at least a partial structure of the bonding wire 16 is located outside a packaging layer 12.

Shapes, quantities, or the like of the first pad 141 and the second pad 142 are not limited in this application. A person skilled in the art can design the first pad 141 and the second pad 142 based on an actual requirement. The bonding wire 16 may be a metal wire or a metal strip. That is, the second circuit layer 14 uses wire bonding and/or clip bonding. A quantity, a position, a shape, and the like of the pad 140 on the second circuit layer 14 are not limited in this application. A person skilled in the art can design the quantity, the position, the shape, and the like of the pad 140 based on an actual requirement.

In this embodiment, the second circuit layer 14 is formed on an upper surface of the packaging layer 12, and the first pad 141 and the second pad 142 on the second circuit layer 14 are electrically connected by using the bonding wire 16, thereby avoiding remelting of the first pad 141 and the second pad 142 in a solder reflow process when the first pad 141 and the second pad 142 are soldered through solder reflow. In this way, reliability of the electronic component package body 10 is improved.

Further refer to FIG. 10. In some embodiments, the electronic component package body 10 further includes a package body 15. The package body 15 is located on a side that is of the substrate 110 and that is away from a circuit board 20. For example, the package body 15 is located on a side that is of the second circuit layer 14 in the substrate 110 and that is away from the packaging layer 12, and the bonding wire 16 is packaged inside the package body 15. The package body 15 uses a magnetic material. For example, the magnetic material is a liquid magnetic material, and the bonding wire 16 is packaged through dispensing by using the liquid magnetic material, to form the package body 15 that uses the magnetic material. A type of the magnetic material is not limited in this application. A person skilled in the art can design the type of the magnetic material based on an actual requirement.

In this embodiment, the pads 140 on the second circuit layer 14 are connected by using the bonding wire 16, and a surface of the second circuit layer 14 is the package body 15 that uses the magnetic material, so that the package body 15 and the bonding wire 16 form a complete winding of a magnetic component (such as a transformer or an inductor). This can prevent an excessive current inside the electronic component package body 10, thereby helping improve reliability of the electronic component assembly structure 100. In addition, the package body 15 is seamlessly connected to the first circuit layer 13, to facilitate heat dissipation of each electronic component 11 in the packaging layer 12, thereby improving heat dissipation performance of the electronic component package body 10.

An insulating material is used inside the magnetic material, and an exterior of the magnetic material is non-conductive, so that the package body 15 that uses the magnetic material is not electrically connected to the bonding wire 16. For example, a metal material is used inside the bonding wire 16, and an exterior of the bonding wire 16 is wrapped by an insulating material, to avoid mutual interference between the bonding wire 16 and the package body 15.

Figure 11:
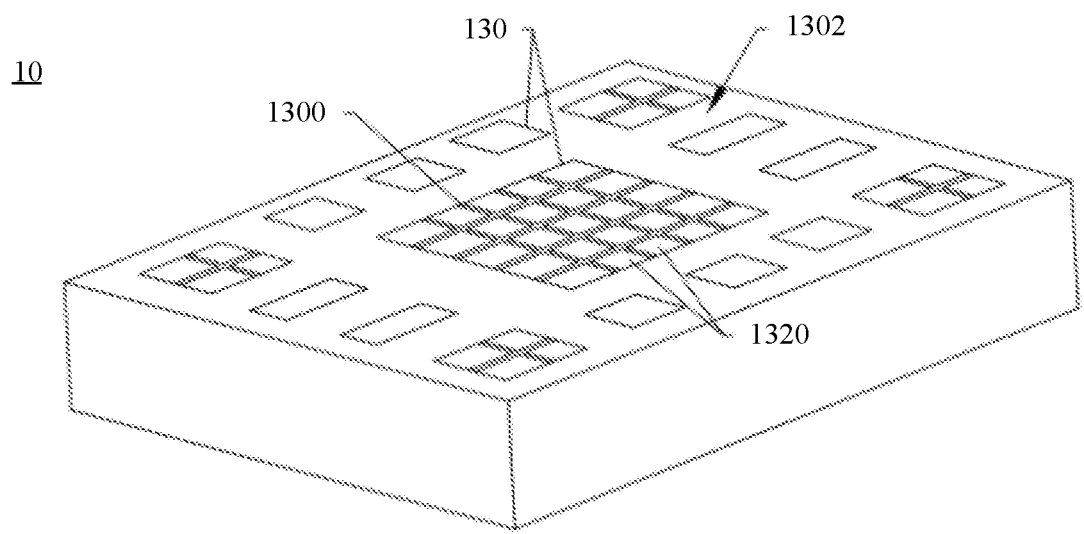
FIG. 11 is a schematic diagram of a structure of an electronic component package body according to Embodiment 4 of this application.
Figure 12:
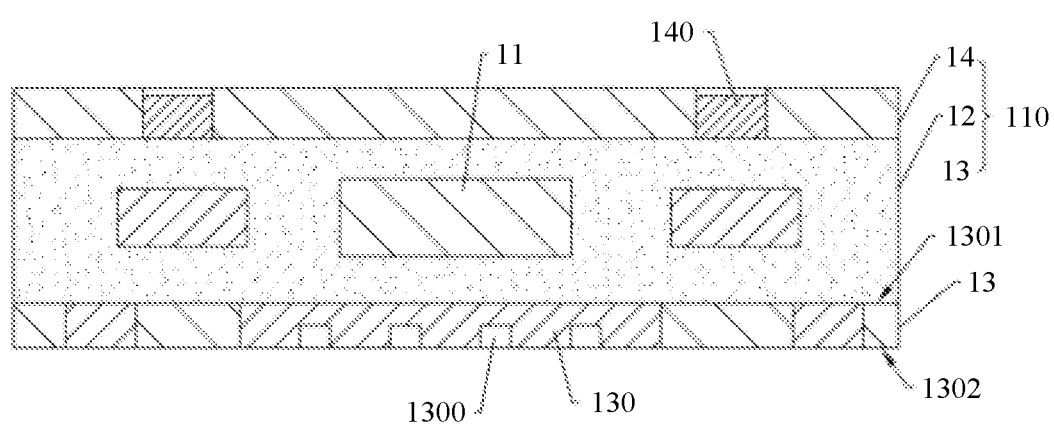
FIG. 12 is a schematic diagram of a partial cross section of the electronic component package body shown in FIG. 11.

Refer to FIG. 11 and FIG. 12. FIG. 11 is a schematic diagram of a structure of an electronic component package body 10 according to Embodiment 4 of this application. FIG. 12 is a schematic diagram of a partial cross section of the electronic component package body 10 shown in FIG. 11.

The following mainly describes differences between this embodiment and the foregoing embodiments, and most content of this embodiment that is the same as the content of the foregoing embodiments is not described again. For example, the electronic component package body 10 includes a substrate 110, an electronic component 11 packaged inside the substrate 110, and a pin 130 electrically connected to the electronic component 11. A plurality of pins 130 are configured to be soldered to a circuit board 20, to implement electrical connection between the electronic component package body 10 and the circuit board 20.

In this embodiment, the pins 130 do not protrude from the substrate 110, and a groove 1300 is disposed on a side that is of at least one of the pins 130 and that is away from the substrate 110. The groove 1300 is recessed from a bottom surface 1321 of the pin 130 to a side of the substrate 110. For example, the bottom surface of the pin 130 is flush with a second surface 1302 of the substrate 110. In another embodiment, the bottom surface of the pin 130 may alternatively be located between a first surface 1301 and the second surface 1302 of a first circuit layer 13.

The groove 1300 does not penetrate the pin 130. It may be understood that the pins 130 are disposed at intervals relative to an exposed surface of the first circuit layer 13, and are connected to each other as a whole on a side close to the substrate 110. For example, a plurality of sub-pins 1320 separated by grooves 1300 use a same electrical network.

In this embodiment, a groove 1300 is disposed on a side that is of a single pin 130 and that is away from the substrate 110, and a solder joint can be embedded in the groove 1300. This not only increases an exposed surface area of the single pin 130, but also enables the pin to be soldered in different dimensions, thereby enhancing soldering strength of the single pin 130, and improving reliability of soldering between the electronic component package body 10 and the circuit board 20. A width, a depth, a quantity, or the like of any groove 1300 is not limited in this application. A person skilled in the art can design a size of the groove 1300 based on an actual requirement or a machine requirement. For example, in a method for preparing the electronic component package body 10, a bottom of a single pin 130 may be segmented, to divide the bottom of the single pin 130 into a plurality of sub-pins 1320 that are disposed at intervals. A segmentation method may be, but is not limited to, etching or a laser.

In some embodiments, a groove 1300 is disposed on a side that is of a pin 130 located on an edge of the electronic component package body 10 in the plurality of pins 130 and that is away from the substrate 110. For example, the electronic component package body 10 is substantially a rectangle, and grooves 1300 are disposed on pins 130 located at four corners of the electronic component package body 10 in the plurality of pins 130. That is, the pins 130 located at the four corners of the electronic component package body 10 in the plurality of pins 130 include a plurality of sub-pins 1320 that are disposed at intervals. It may be understood that, when the electronic component package body that is soldered to the circuit board and that is in an electronic device uses the electronic component package body provided in Embodiment 4, the solder joint not only surrounds the bottom surface of the pin, but also fills the groove on the bottom surface of the pin, thereby increasing a soldering area between the solder joint and the pin.

In this embodiment, a possibility of a fatigue failure caused by vibration of the electronic component assembly structure 100 is relatively high for a pin 130 at an edge of the electronic component package body 10. Therefore, the pin 130 at the edge of the electronic component package body 10 is segmented to form a plurality of sub-pins 1320 that are disposed at intervals. This not only improves soldering reliability of the edge pin 130, but also avoids increasing costs by segmenting all pins 130. In another embodiment, a side that is of each pin 130 and that is away from the substrate 110 may alternatively have a plurality of sub-pins 1320 that are disposed at intervals. This is not limited in this application.

In some embodiments, a pin 130 with a largest surface area in the plurality of pins 130 includes a plurality of sub-pins 1320 that are disposed at intervals. As shown in FIG. 11, a surface area of a pin 130 located in a middle area of the electronic component package body 10 is largest, and the pin 130 includes a plurality of sub-pins 1320 that are disposed at intervals, to further improve reliability of soldering between the electronic component package body 10 and the circuit board 20.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic component assembly structure, comprising:
   an electronic component package body, wherein the electronic component package body comprises a substrate, an electronic component, and a pin; wherein:
      the electronic component is packaged inside the substrate, and the pin is electrically connected to the electronic component;
      the pin comprises a first part and a second part connected to the first part, the first part is embedded in the substrate, and the second part protrudes from the substrate; and
      the second part comprises a bottom surface and a side surface, the bottom surface is an outer surface that is of the pin and that is away from the substrate, and the side surface is connected between the bottom surface and the substrate;
   a side of the substrate and away from the circuit board comprises a first pad and a second pad, and the first pad and the second pad are disposed at intervals;
   a circuit board, wherein the electronic component package body is mounted on the circuit board, and the circuit board is electrically connected to the electronic component; and
   a solder joint, wherein the solder joint is connected between the pin and the circuit board and surrounds the bottom surface and the side surface of the second part.

2. The electronic component assembly structure according to claim 1, wherein the pin comprises a plurality of pins, the plurality of pins are disposed at intervals, and a side surface of at least one of the pins comprises: an inclined surface, a stepped surface, or a curved surface.

3. The electronic component assembly structure according to claim 1, wherein the solder joint comprises a first segment and a second segment connected to the first segment;
   wherein the first segment is connected between the bottom surface and the circuit board, and the second segment is disposed around a periphery of the side surface; and
   wherein a projection of the second segment on the circuit board partially overlaps a projection of the bottom surface on the circuit board.

4. The electronic component assembly structure according to claim 1, wherein a material used for the solder joint comprises tin, and wherein main materials used for the first part and the second part are different from the material used for the solder joint.

5. The electronic component assembly structure according to claim 1, wherein the electronic component assembly structure further comprises a groove, the groove is disposed on a side that is of the pin and that faces the circuit board, the groove is recessed from the bottom surface of the pin to a side of the substrate, and a partial structure of the solder joint is embedded in the groove.

6. The electronic component assembly structure according to claim 1, wherein the electronic component assembly structure further comprises a bonding wire, and the bonding wire is electrically connected between the first pad and the second pad.

7. The electronic component assembly structure according to claim 2, wherein an area of the bottom surface is greater than an area of a cross section that is of the at least one of the pins and that is along a surface of the substrate.

8. The electronic component assembly structure according to claim 6, wherein the electronic component package body further comprises a package body, the package body is located on the side that is of the substrate and that is away from the circuit board, the bonding wire is packaged inside the package body, and the package body uses a magnetic material.

9. An electronic component assembly structure, comprising:
- an electronic component package body, wherein the electronic component package body comprises a substrate, an electronic component, and a pin; wherein:
  - the electronic component is packaged inside the substrate, and the pin is electrically connected to the electronic component;
  - a groove is disposed on a side that is of the pin and that is away from the electronic component, and the groove is recessed from a bottom surface of the pin to a side of the electronic component;
  - a side of the substrate and away from the pin comprises a first pad and a second pad, and the first pad and the second pad are disposed at intervals;
  - the electronic component package body further comprises a bonding wire and a package body, the bonding wire is electrically connected between the first pad and the second pad, and the package body is located on the side of the substrate and away from the pin; and
  - the bonding wire is packaged inside the package body, and the package body uses a magnetic material;
- a circuit board, wherein the electronic component package body is mounted on the circuit board, and the circuit board is electrically connected to the electronic component; and
- a solder joint, wherein the solder joint is connected between the pin and the circuit board, and the solder joint is embedded in the groove.

10. An electronic device, comprising an electronic component assembly structure, wherein the electronic component assembly structure, comprises:
- an electronic component package body, wherein the electronic component package body comprises a substrate, an electronic component, and a pin; wherein:
  - the electronic component is packaged inside the substrate, and the pin is electrically connected to the electronic component;
  - the pin comprises a first part and a second part connected to the first part, the first part is embedded in the substrate, and the second part protrudes from the substrate;
  - the second part comprises a bottom surface and a side surface, the bottom surface is an outer surface that is of the pin and that is away from the substrate, and the side surface is connected between the bottom surface and the substrate;
  - a side of the substrate and away from the pin comprises a first pad and a second pad, and the first pad and the second pad are disposed at intervals;
  - the electronic component package body further comprises a bonding wire and a package body, the bonding wire is electrically connected between the first pad and the second pad, and the package body is located on the side of the substrate and away from the pin; and
  - the bonding wire is packaged inside the package body, and the package body uses a magnetic material;
- a circuit board, wherein the electronic component package body is mounted on the circuit board, and the circuit board is electrically connected to the electronic component; and
- a solder joint, wherein the solder joint is connected between the pin and the circuit board and surrounds the bottom surface and the side surface of the second part.

11. An electronic component package body, comprising: a substrate, an electronic component, and a pin; wherein:
- the electronic component is packaged inside the substrate, and the pin is electrically connected to the electronic component;
- a side of the substrate and away from the pin comprises a first pad and a second pad, and the first pad and the second pad are disposed at intervals;
- the electronic component package body further comprises a bonding wire and a package body, the bonding wire is electrically connected between the first pad and the second pad, and the package body is located on the side of the substrate and away from the pin;
- the bonding wire is packaged inside the package body, and the package body uses a magnetic material;
- the pin comprises a first part and a second part connected to the first part, the first part is embedded in the substrate, and the second part protrudes from the substrate; and
- the second part comprises a bottom surface and a side surface, the bottom surface is an outer surface that is of the pin and that is away from the substrate, the side surface is connected between the bottom surface and the substrate, and both the bottom surface and the side surface are used for soldering with solder.

12. The electronic component package body according to claim 11, wherein the pin comprises a plurality of pins, the plurality of pins are disposed at intervals, and a side surface of at least one of the pins comprises: an inclined surface or a stepped surface; or
- wherein a second part of at least one of the pins is a circular truncated cone.

13. The electronic component package body according to claim 11, wherein the electronic component further comprises a groove, the groove is disposed on a side that is of the pin and that is away from the substrate, and the groove is recessed from the bottom surface of the pin to a side of the substrate.

14. The electronic component package body according to claim 12, wherein an area of the bottom surface is greater than an area of a cross section that is of the at least one of the pins and that is along a surface of the substrate.

15. The electronic component package body according to claim 12, wherein a material used for the second part comprises copper or aluminum.

16. An electronic component package body comprising: a substrate, an electronic component, and a pin; wherein:
- the electronic component is packaged inside the substrate, and the pin is electrically connected to the electronic component;
- a groove is disposed on a side that is of the pin and that is away from the electronic component, the groove is recessed from a bottom surface of the pin to a side of the electronic component, and the groove is configured to be filled with solder;
- a side of the substrate and away from the pin comprises a first pad and a second pad, and the first pad and the second pad are disposed at intervals;
- the electronic component package body further comprises a bonding wire and a package body, the bonding wire is electrically connected between the first pad and the second pad, and the package body is located on the side of the substrate and away from the pin; and
- the bonding wire is packaged inside the package body, and the package body uses a magnetic material.

17. An electronic device comprising an electronic component assembly structure, wherein the electronic component assembly structure comprises:
- an electronic component package body, wherein the electronic component package body comprises a substrate, an electronic component, and a pin; wherein:
  - the electronic component is packaged inside the substrate, and the pin is electrically connected to the electronic component;
  - a groove is disposed on a side that is of the pin and that is away from the electronic component, and the groove is recessed from a bottom surface of the pin to a side of the electronic component;
  - a side of the substrate and away from the pin comprises a first pad and a second pad, and the first pad and the second pad are disposed at intervals;
  - the electronic component package body further comprises a bonding wire and a package body, the bonding wire is electrically connected between the first pad and the second pad, and the package body is located on the side of the substrate and away from the pin; and
  - the bonding wire is packaged inside the package body, and the package body uses a magnetic material;
- a circuit board, wherein the electronic component package body is mounted on the circuit board, and the circuit board is electrically connected to the electronic component; and
- a solder joint, wherein the solder joint is connected between the pin and the circuit board, and the solder joint is embedded in the groove.

* * * * *